United States Patent [19]
Umotoy et al.

[11] Patent Number: 5,888,304
[45] Date of Patent: Mar. 30, 1999

[54] HEATER WITH SHADOW RING AND PURGE ABOVE WAFER SURFACE

[75] Inventors: Salvador P. Umotoy, Antioch; Alan F. Morrison, San Jose; Karl A. Littau, Palo Alto, all of Calif.; Richard A. Marsh, Austin, Tex.; Lawrence Chung-Lai Lei, Milpitas; Dale DuBois, Los Gatos, both of Calif.

[73] Assignee: Applied Materials, Inc., Santa Clara, Calif.

[21] Appl. No.: 626,789

[22] Filed: Apr. 2, 1996

[51] Int. Cl.[6] .................................................. C23C 16/00
[52] U.S. Cl. ..................... 118/720; 118/728; 118/729; 118/500; 118/504; 156/345; 427/248
[58] Field of Search ................... 118/720, 721, 118/728, 730, 500, 503, 504, 729; 156/345; 427/248.1

[56] References Cited

U.S. PATENT DOCUMENTS

| | | | |
|---|---|---|---|
| 4,860,687 | 8/1989 | Frijlink | 118/500 |
| 5,226,383 | 7/1993 | Bhat | 118/730 |
| 5,238,499 | 8/1993 | Van De Ven et al. | 118/724 |
| 5,292,554 | 3/1994 | Sinha et al. | 427/251 |
| 5,304,248 | 4/1994 | Cheng et al. | 118/728 |
| 5,326,725 | 7/1994 | Sherstinsky et al. | 437/225 |
| 5,343,938 | 9/1994 | Schmidt | 165/80.2 |
| 5,383,971 | 1/1995 | Selbrede | 118/728 |
| 5,468,299 | 11/1995 | Tsai | 118/730 |
| 5,474,612 | 12/1995 | Sato et al. | 118/725 |
| 5,476,548 | 12/1995 | Lei et al. | 118/728 |
| 5,516,367 | 5/1996 | Lei et al. | 118/725 |
| 5,534,072 | 7/1996 | Mizuno et al. | 118/728 |
| 5,558,721 | 9/1996 | Kohmura et al. | 118/730 |

*Primary Examiner*—R. Bruce Breneman
*Assistant Examiner*—Jeffrie R Lund
*Attorney, Agent, or Firm*—Cooley Godward, LLP; Raymond K. Kwong, Esq.; Craig P. Opperman, Esq.

[57] ABSTRACT

This invention provides a method and apparatus for supporting a wafer in a processing chamber, where the wafer is supported and heated from below via a heater pedestal having a diameter larger than that of the wafer. A process fluid flowing downward toward the top of the wafer is inhibited from depositing near the wafer edge by a shadow ring. The shadow ring, which is placed over but does not contact the wafer, physically masks an annular strip of the wafer near its edge. The shadow ring inhibits deposition of process fluides on the wafer in two distinct ways. First, the shadow ring physically obstructs process gas, flowing downward from above the wafer, from depositing on the masked portion of the wafer. Second, the shadow ring is used to direct a flow of a purge gas to inhibit process gas from seeping under the shadow ring and depositing near the wafer edge. A purge gas manifold is defined by a cylindrical annulus located concentrically below the shadow ring and circumscribing the heater pedestal. A purge gap between the wafer and the shadow ring forms the outlet of the purge gas manifold. The purge gas flows out of the purge gap, inhibiting the process gas from entering the purge gap, and thus further inhibiting deposition on the masked portion of the wafer.

28 Claims, 3 Drawing Sheets

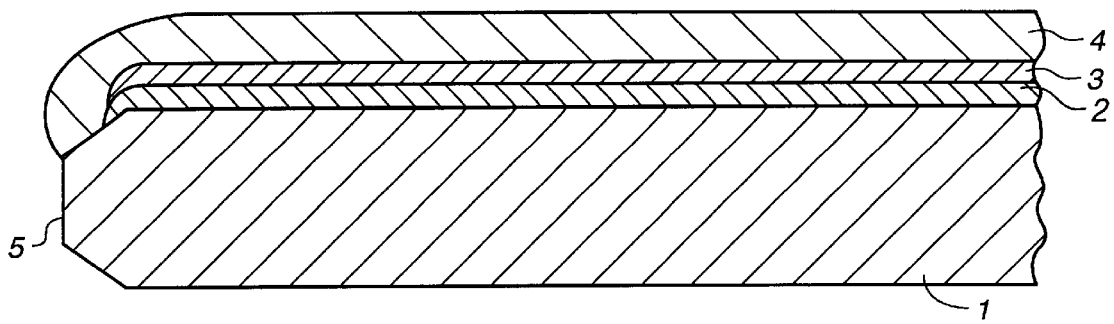
FIG._1a
(PRIOR ART)
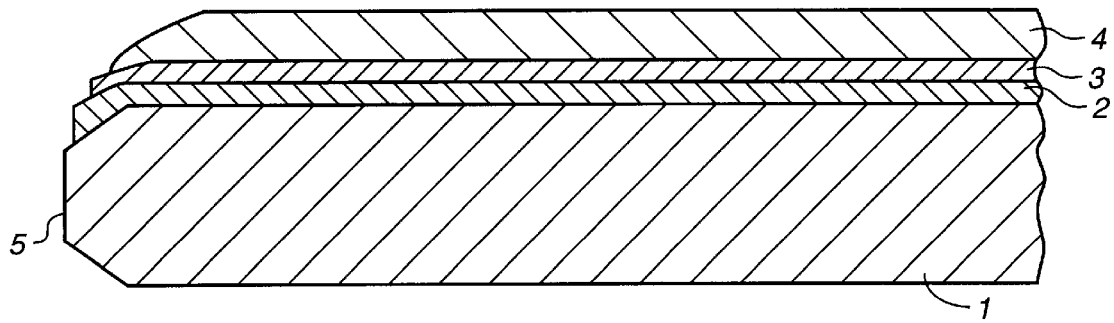
FIG._1b
(PRIOR ART)
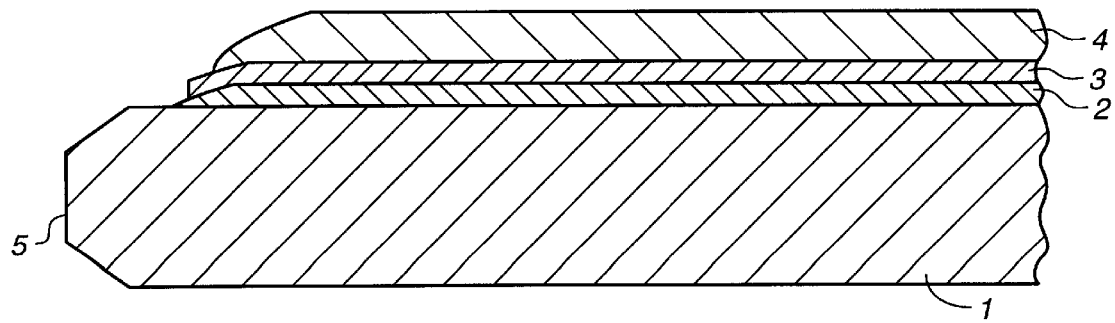
FIG._1c
(PRIOR ART)

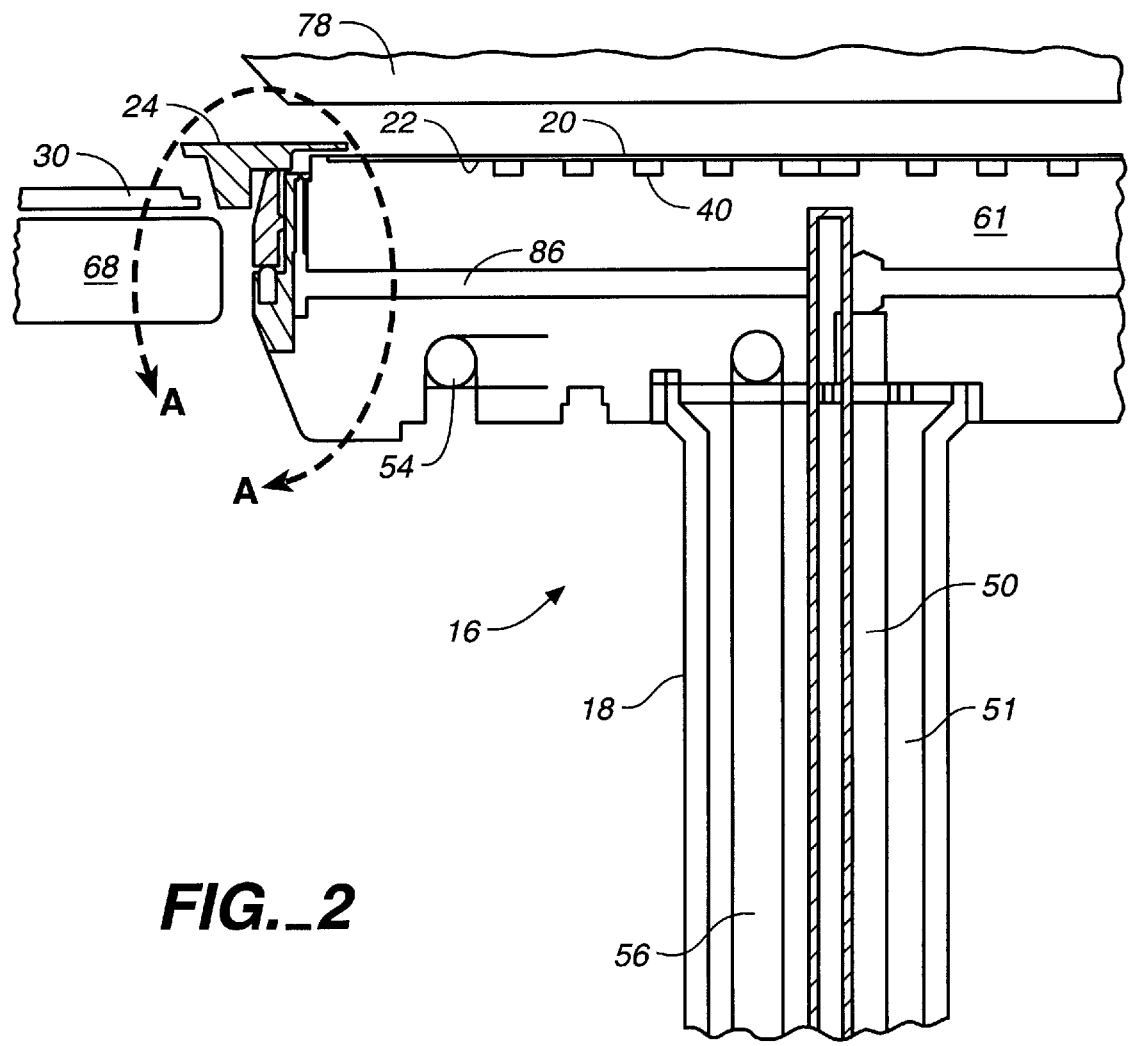
FIG._2

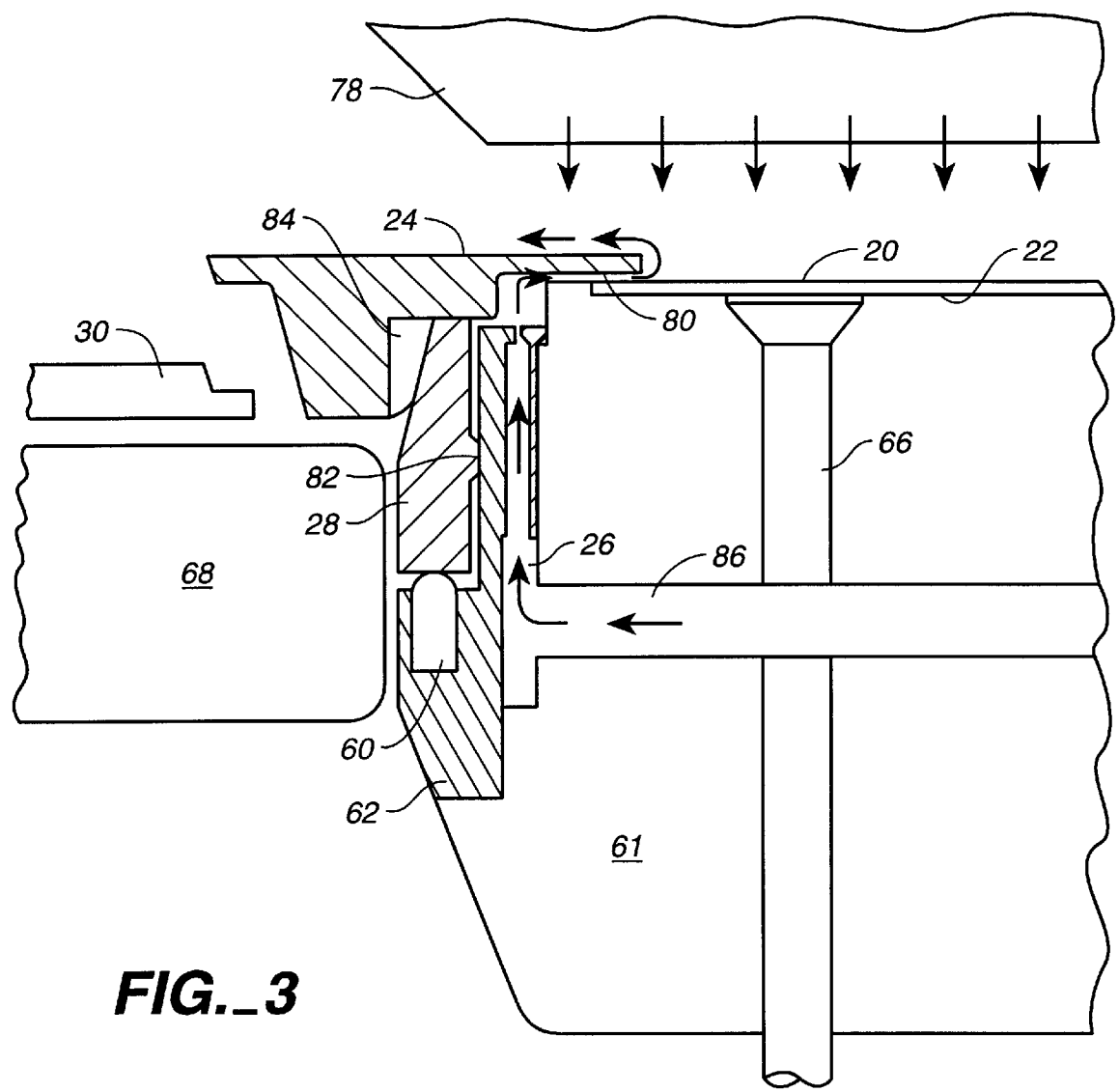
FIG._3

HEATER WITH SHADOW RING AND PURGE ABOVE WAFER SURFACE

BACKGROUND

TECHNICAL FIELD

This invention relates to a method and apparatus for depositing useful layers of materials on substrates, for example, semiconductor wafers, used in the manufacture of semiconductor dies. More particularly, this invention relates to a method and apparatus for reducing unwanted deposition on the edge of a wafer.

Overview of Chemical Vapor Deposition

Chemical vapor deposition, commonly referred to as "CVD," is one of a number of processes used to deposit thin layers of material on a semiconductor wafer. To process wafers with the CVD process, a vacuum chamber is provided with a susceptor configured to receive a wafer thereon. In a typical prior art CVD chamber, the wafer is placed into and removed from the chamber by a robot blade and is supported by the susceptor during processing. In these typical systems, the susceptor and the wafer are heated to a temperature of between 200°–650° C. prior to processing. Once the wafer is heated to an appropriate temperature, a processing fluid, typically a gas, is charged to the vacuum chamber through a gas manifold often situated above the wafer. The processing gas reacts with the heated wafer surface to deposit a thin material layer thereon. As the gas thermally reacts to form the material layer, volatile byproduct gases are formed, and these gases are pumped out of the vacuum chamber through a chamber exhaust system.

A primary goal of wafer processing is to obtain as many useful die as possible from each wafer. Many factors influence the processing of wafers in the CVD chamber and affect the ultimate yield of die from each wafer processed therein. These factors include processing variables, which affect the uniformity and thickness of the material layer deposited on the wafer, and particulate contaminants that can attach to a wafer and contaminate one or more die therein. Both of these factors must be controlled in CVD and other processes to maximize the die yield from each wafer.

Particulate Contamination due to Unwanted Deposition Near the Wafer Edge

One of the causes of particulate contaminants in the chamber is improper deposition at the edge of a wafer. Because edge deposition conditions are difficult to control, due in part to the fact that wafer edges are typically chamfered, incomplete or improper deposition can occur around a wafer's edge. This may lead to deposited layers not adhering properly to each other and/or not adhering properly to the wafer.

This problem is illustrated in FIG. 1(a) which is a schematic partial cross-section of a typical semiconductor wafer. For this example, the wafer 1 is shown with three consecutive layers 2, 3, and 4 deposited thereon. Metals such as tungsten can be deposited on the wafer as the upper layer 4 after depositing intermediate layers 2 and 3 (or more layers, if necessary) on the wafer.

Such a three-layer process for the deposition of tungsten is common as tungsten does not readily adhere to the silicon (or oxidized silicon) surface of the wafer. Accordingly a very thin "primer" layer 2 is deposited, followed by a second layer 3 of a material to which tungsten layer 4 readily adheres. As can be seen from FIG. 1(a), however, the tungsten layer 4 has "wrapped" around onto the beveled outer edge 5 of the wafer to contact directly with the silicon wafer.

The problem with this wrap around is that tungsten does not adhere to the silicon wafer surface and could readily chip and flake during the handling of the wafer, resulting in particulate contaminants.

An idealized edge cross-section is, therefore, that illustrated in FIG. 1(b) in which all three layers terminate at or close to the same point with respect to the wafer's edge, preferably above the chamfer, with the metal layer 4 being the furthest back from the edge of the wafer.

Unwanted Deposition Near the Wafer Edge due to Heating

A factor which affects the uniformity of the deposition material layer is the method used for heating the wafer. One method involves heating the wafer with infrared lamps through quartz walls of a reaction chamber. If the heat distribution is non-uniform the wafer may warp, leading to non-uniform deposition on the top of the wafer as well as unwanted deposition from process gas seeping under upraised portions of the edge of the wafer.

Another method for heating the wafer is to use a heater pedestal for both supporting and heating the wafer. An example of this arrangement is described in the co-pending U.S. patent application Ser. No. 08/200,862 filed on Feb. 23, 1994, now U.S. Pat. No. 5,695,568 and titled "Improved Chemical Vapor Deposition Chamber." In this arrangement, the wafer is supported on a flat supporting surface of a heater pedestal mounted on a vertical stalk within the chamber. The pedestal is heated from within by means of an electrical heating coil, and the wafer, in turn, is heated by the hot supporting pedestal. In order to provide improved uniformity of heating of the wafer, the pedestal embodies of a vacuum chuck in which a "vacuum" is drawn at the interface between the underside of the wafer and the flat supporting surface of the pedestal. The resulting pressure differential across the wafer draws the wafer onto the pedestal resulting in improved uniformity of heating of the wafer. But as a result of this vacuum drawn at the backside of the wafer, processing gas can be drawn around the edge of the wafer and into the interface between the wafer and the pedestal. This can result in unwanted edge and backside deposition, leading to the generation of particle contaminants as described earlier. Accordingly, the improved uniformity of heating is accompanied by a possible increase in unwanted edge and backside deposition.

PRIOR ART

1. Purge Gas Ring

One solution to this problem of unwanted edge deposition is to use a purge gas ring which defines a manifold between itself and the heater body. During processing, a purge fluid, such as a gas, is injected through the heater body into the manifold and is projected toward the edge of the wafer at the outlet of the manifold. Consequently, processing gas is inhibited from contacting the extreme edge portion of the wafer. This reduces unwanted deposition on the peripheral edge and lower surface of the wafer, producing a deposit pattern as shown in FIG. 1(b).

2. Shadow Ring

Another solution to this problem is to provide a shadow ring which is located over and in contact with a narrow, peripheral area of the wafer to prevent deposition thereon. As shown in FIG. 1(c), use of the shadow ring provides an undeposited annular strip around the wafer edge, which is sometimes desirable from a wafer handling perspective. However, the shadow ring is also not as successful as might be desired because of wafer warpage and the fact that the volatile deposition gas still tends to migrate under the lip of the shadow ring and deposit unwanted material on the wafer edge and backside.

The need therefore exists for a method and apparatus for controlling the deposition of materials at or around the edge of a semiconductor wafer during CVD and/or other wafer processing operations.

Further, in some processes, cleaning deposits from components within the chamber is difficult to achieve. For example, the cleaning may often need be accomplished by physical scrubbing or chemical bathing of individual components. Such deposits are most likely to occur on surfaces which are immediately adjacent the wafer and on surfaces which are suitably heated. Accordingly, there is a need to reduce the amount of deposition on such surfaces and make them relatively easily cleanable.

SUMMARY OF THE INVENTION

This invention provides a method and apparatus for supporting a wafer in a processing chamber, where the wafer is supported and heated from below via a heater pedestal. A process gas flowing downward toward the top of the wafer is inhibited from depositing near the wafer edge by a shadow ring. The shadow ring, which is placed over but does not contact the wafer, physically masks an annular strip of the wafer near its edge.

The shadow ring inhibits deposition of process gases on the wafer in two distinct ways. First, the shadow ring physically obstructs process gas, flowing down from above the wafer, from depositing on the masked portion of the wafer. Second, the shadow ring is used to direct a flow of a purge gas to inhibit process gas from seeping under the shadow ring and depositing near the wafer edge.

A purge gas manifold is defined by a cylindrical annulus located concentrically below the shadow ring to circumscribe the heater pedestal. A purge gap between the wafer and the shadow ring forms the outlet of the purge gas manifold. The purge gas flows out of the purge gap, inhibiting the process gas from entering the purge gap, and thus further inhibiting deposition on the masked portion of the wafer.

The shadow ring is vertically supported from below (and thus prevented from touching the wafer) by a support ring which circumscribes the heater pedestal. The support ring is made of a material having a lower thermal expansivity than the material of the pedestal. The resulting thermal expansion differential is instrumental in the formation of a mechanical seal, between the support ring and the heater pedestal, at elevated temperatures such as during processing. This seal prevents process gases from seeping between the support ring and the pedestal. Conversely, at low temperatures such as room temperature, the support ring loosely fits onto the heater pedestal allowing the shadow ring to be freely removed for cleaning.

The support ring and shadow ring typically also have lower thermal conductivity than the heater pedestal, which reduces heat transfer from the heater pedestal to the rings. As the amount of deposition is temperature-dependent, keeping the support ring and shadow ring relatively cool reduces deposition on these rings. In a preferred embodiment, the heater pedestal is made of aluminum, the support ring is made of stainless steel, and the shadow ring is made of a ceramic or stainless steel.

The support ring is supported on supporting pins embedded in a circular shoulder which extends outward from the heater pedestal. As a result the support ring is vertically supported clear of the heater pedestal and there is less heat transfer from the pedestal to the support ring (and thus to the shadow ring). The support and shadow rings therefore operate at lower temperatures and experience reduced deposition. In the preferred embodiment, three ceramic pins located at equal distances around the circumference of the shelf, are used to provide stability without wobbling. The top of each pad is preferably convex, to further reduce wobble and to further minimize heat transfer from the pedestal/ aluminum ring to the support and shadow rings. The heat transfer is further inhibited by minimizing the contact areas between the support ring/heater pedestal, and between the support ring/shadow ring.

This invention finds particular application in, but is not limited to, semiconductor wafer processing chambers which process such wafers using a metal CVD process.

A primary advantage of this invention is that it reduces the occurrence of deposition near the edge of the wafer. This in turn reduces particle contaminants originating from unwanted near-edge deposition that inadequately adheres to the surface. Another advantage of this invention is that the support ring may easily be removed for wet or mechanical cleaning. These advantages and further details of the present invention will become apparent to one skilled in the art from the following detailed description and accompanying drawings.

BRIEF DESCRIPTION OF THE DRAWINGS

In the accompanying drawings:

FIG. 1(a) is a partial cross-section of a semiconductor wafer illustrating non-ideal deposition of material layers at the edge of the wafer;

FIGS. 1(b) and 1(c) are partial cross-sections of a semiconductor wafer illustrating improved deposition of material layers at the edge of the wafer;

FIG. 2 is an partial sectional view of the improved heater pedestal of this invention.

FIG. 3 is an enlarged partial sectional view of the upper portion of the improved heater pedestal of this invention.

DESCRIPTION OF THE INVENTION

Introduction

A heater pedestal of the invention is shown in FIG. 2. As will be apparent from the description below, the pedestal can be used to reduce the deposition of material on a semiconductor wafer's underside and edge. The pedestal is shown to include edge protection in the form of a circumferential shadow ring 24 positioned adjacent to the periphery of a wafer 20 received on the supporting surface 22 of the heater pedestal 16. FIG. 3 is a detailed view of the upper portion of the heater pedestal shown as region "A" in FIG. 2.

Once the wafer 20 is positioned and processing begins, a continuous flow of purge gas, about the entire edge of the wafer, is provided through a purge gap 80 defined by shadow ring 24 and a masked portion of the wafer 20. The purge flow has the effect that little or no deposition occurs on the edge of wafer 20, or on the underside of wafer 20 immediately adjacent to the edge. In addition, shadow ring 24 prevents process gas from process gas manifold 78 from depositing on the top of wafer 20 immediately adjacent to the edge. The resulting configuration of deposited layers of material could resemble that illustrated in FIG. 1(c).

Detailed Description

1. Pedestal Architecture

In FIG. 2, the heater pedestal 16 is shown to comprise a main body 61 supported by a vertical stalk 18. Within the stalk 18 are, in addition to the vacuum conduit 50, a purge gas conduit 51, a housing containing a thermocouple (not shown) for measuring the temperature of the pedestal, and a conduit 56 for supplying power to a heating element 54 located within the main body 61 of the pedestal 16. Main body 61 has a supporting surface 22 on which a semiconductor wafer can be supported. Surface 22 includes a plurality of concentric vacuum grooves 40 for applying a vacuum to draw the wafer 20 onto the supporting surface 22 for improved uniformity of heating during operation. These concentric grooves 40 are typically 0.21 mm (0.08 inches) wide and 0.38 mm (0.015 inches) deep and 2.97 mm (0.117 inches) apart. Wafer lift fingers 66 (shown in FIG. 3) operate to lift the wafer clear of the supporting surface 22 of the pedestal 16 so that the wafer can be inserted for, or removed after, processing. These wafer transfers are achieved by means of a conventional processing apparatus robot arm (not shown) which enters the chamber through a port 68 (shown in FIG. 3) that is selectively opened through a slit valve (not shown). The same robot arm is also used to place wafers 20 in position for processing. The lift fingers 66 are movable vertically under action of a lifting mechanism which is well known in the art.

A removable shadow ring 24 circumscribes the main body 61 and rests on supporting ring 28, which in turn rests on three supporting pins 60 equally spaced around the main body 61. The supporting pins 60 are embedded in aluminum ring 62, which is welded to, and an integral part of, main body 61 (which is also made of aluminum). Aluminum ring 62 and the core of main body 61 define a purge gas manifold 26, which would be difficult to machine from a single piece of material. Purge gas manifold 26 is fed by eight purge gas channels 86 formed in main body 61. Purge gas manifold 26 serves to distribute and equalize the pressure/flow of purge gas received from purge gas channels 86. These purge gas outlets 86 are in communication with a purge gas supply (not shown) via purge gas conduit 51 (shown in FIG. 2).

Purge gas manifold 26 feeds a purge gap 80 defined between the shadow ring 24 and the wafer 20. Purge gas manifold 26 also distributes and equalizes the pressure/flow of purge gas out of purge gap 80. Purge gap 80 is dimensioned to allow sufficient flow of purge gas to prevent deposition on the edge and underside of the wafer. In one embodiment of the invention, the purge gap 80 is 0.023 to 0.030 inches (0.58 to 0.76 mm) when the apparatus is at operating temperature.

Although the figures illustrate an embodiment suitable for use with a circular wafer, it should be noted that the purge gap 80 should follow the perimeter of the wafer. Accordingly, if a non-circular wafer (such as a wafer with a "wafer flat" formed in it) is being processed, the purge gap should be formed to follow the irregular perimeter. Furthermore, though the illustrated embodiment comprises a supporting surface 22 having a pocket for supporting the wafer, the invention may be used with supporting surfaces having different configurations, such as a pocketless wafer supporting surface.

2. Heat Transfer Considerations

Contact minimization and material selection are used to reduce heat transfer from the main body 61 to shadow ring 24 and support ring 28. Contact minimization at the interface between aluminum ring 62/support ring 28 and at the interface between support ring 28/shadow ring 24 reduces the heat transfer across these interfaces, which reduces unwanted deposition on the rings by keeping them relatively cool. Thus, support ring 28 contacts shadow ring 24 over a plurality of equally spaced ribs 84 rather than over the shadow ring's entire circumference. Similarly, support ring 28 contacts main body 61 only over a small circumferential flange 82 and a plurality of dome-shaped pins 60.

Material selection is used to further reduce the heat transfer. Thus, shadow ring 24 and support ring 28 are made of materials that have lower coefficients of thermal conductivity and thermal expansivity than the material of the main body 61. In a preferred embodiment, shadow ring 24 is made from a ceramic or from a nickel-chromium-iron alloy such as 316L stainless steel, and support ring 28 is made from nickel-chromium-iron stainless steel. The rings' lower thermal conductivity reduces heat transfer from the aluminum ring 62/main body 61 to the rings. Similarly, support pins 60 are made of a ceramic such as alumina which has a poor thermal conductivity.

3. Wafer Processing

FIG. 3 depicts a wafer positioned on a movable heater pedestal during normal operation, i.e., when the heater pedestal is in its uppermost position, after wafer loading has been accomplished. Although FIG. 3 does not depict the wafer loading process, details of this process may be visualized with the aid of the figure. At the start of processing, heater pedestal 16 is lowered until the shadow ring 24 is caught by pumping plate 30. As the pedestal is further lowered, wafer lift fingers 66 hit a vertical stop (not shown) and remain stationary while the rest of the heater pedestal continues to move downward. Thus, wafer lift fingers 66 become vertically extended clear of the supporting surface 22. When the heater pedestal 16 reaches its lowest position (not shown), a robot blade (not shown) holding an appropriately dimensioned semiconductor wafer enters the chamber through an opening 68 in the chamber wall. As the heater pedestal 16 is raised, the extended wafer lift fingers 66 pick up the wafer from the robot blade and the blade is retracted out of the chamber. As the heater pedestal 16 continues to move upward, past the wafer lift finger stops, the wafer lift fingers 66 retract into the main body 61 and the shadow ring 24 is lifted off of pumping plate 30 by support ring 28. Eventually, the heater pedestal reaches its operating position as shown in FIG. 3. At this point, processing can begin.

A typical CVD metal deposition process has two discrete deposition steps. During the first step, lasting about thirty (30) seconds, the pressure in the chamber is reduced to about 0.6 kPa (4.5 Torr) and a metal deposition gas introduced into the chamber. This step, known as a nucleation step, results in a very thin layer of metal being deposited on the wafer. This thin layer serves as a base layer onto which further layers of metal are deposited.

During the second deposition step, lasting less than 60 seconds and during which most of the metal is deposited, a "vacuum" is drawn at the interface between the wafer and the supporting surface 22 of the pedestal 16. This is achieved by drawing a vacuum to about 2.7 Kpa (20 Torr) through the vacuum grooves 40 via the conduit 50. As the interior pressure of the chamber during processing is approximately 10.7 to 12 Kpa (80 to 90 Torr), a pressure differential exists across the wafer. This causes the wafer to be drawn against the supporting surface 22 of the pedestal 16. The advantage of this tight contact is that heat from the pedestal is more uniformly transmitted from the pedestal to the wafer. This leads to a uniform heating of the wafer and, therefore, improved deposition of metal on the wafer surface.

The pedestal 16, in turn, is resistively heated by means of the electrically powered heating coil 54 mounted within the body of the pedestal 16. The coil 54 is supplied with electrical power along a rigid, stainless steel connecting stem 56 located within the body of the stalk 18. Although only one coil is shown in this figure, more than one coil could be used or even multiple heating elements which are nested together but powered separately.

When the pedestal 16 is heated, aluminum ring 62/main body 61 expands radially outward due to increased temperature. The support ring 28, which is made of stainless steel having a lower coefficient of thermal expansivity and is at a lower temperature, does not expand as much. The outer face of the pedestal thus comes into horizontal contact with the protruding inner edge of the support ring 28, creating a mechanical seal at the interface 82 between the support ring and the pedestal. This seal inhibits process gas from seeping between aluminum ring 62/main body 61 and support ring 28.

During the second deposition step, an inert purge gas such as argon is supplied at approximately 4.2 cubic feet per minute (two liters per second) by a purge gas supply (not shown) through purge gas manifold 26 and out purge gap 80, at a pressure great enough to substantially prevent process gas from migrating into purge gap 80. Once the purge gas has flowed out of purge gap 80, it enters the processing chamber to be exhausted through standard exhausts in the chamber (not shown).

The supply of this purge gas has a particularly advantageous effect in that it substantially reduces or eliminates deposition of metal on the edge and outer portion of the underside of the wafer. This is because the purge gas flows out continually and at high mass flow rates through the purge gap 80, effectively diluting deposition gas and preventing its diffusion into the vicinity of the wafer edge. In addition, deposition around the outer portion of the top of the wafer is directly inhibited because the shadow ring physically obstructs the process gas from flowing vertically downward in a direction perpendicular to the masked portion of the wafer. Therefore, deposition in the entire near-edge region is reduced by the combination of the shadow ring and the purge gas.

5. Removing the Shadow and Support Rings for Cleaning at Room Temperature

As mentioned previously, rings 24 and 28 have lower thermal conductivity than the main body 61. In addition, the rings also have lower thermal expansivities. FIG. 3 depicts the innermost face of support ring 28 in contact with aluminum ring 62/main body 61, at elevated temperatures as during processing. However, because of the difference in thermal expansivities, when the apparatus cools to room temperature (not shown), aluminum ring 62/main body 61 contracts more than (radially away from) support ring 28. This differential contraction forms a gap between aluminum ring 62/main body 61 and support ring 28, which allows support ring 28 (and shadow ring 24) to be freely removed for cleaning without loosening any mechanical fasteners. This is especially important for processes, such as aluminum deposition, in which cleaning must be accomplished by physical scrubbing or chemical bathing of individual components.

Although the present invention has been described above in terms of a specific embodiment (that of an apparatus for use in a CVD process), it is anticipated that alterations and modifications to this invention will no doubt become apparent to those skilled in the art. For example, the wafer need not be heated by an electrical element within the heater pedestal, but could be heated by infrared lamps outside a quartz processing chamber. As another example, the shadow ring need not be supported mechanically by the support ring, but could be supported by a buoyant lift of the purge gas or mechanically attached to an upper gas manifold. Additionally, although the invention has been described for use in a thermal CVD chamber, the components herein are equally suited for use in plasma deposition and other wafer processing operations. Also, for plasma deposition, it is preferably for both shadow ring and support ring to be ceramic. It is therefore intended that the following claims be interpreted as covering all such alterations and modifications as fall within the true spirit and scope of the invention.

What is claimed is:

1. A method for inhibiting a process fluid from contacting a portion of a substrate, supported on a substrate support in a processing chamber, comprising the steps of:
    (a) providing a mask, positioned over and separated from the substrate, to obstruct the process fluid from flowing in a direction substantially perpendicular to a masked portion of the substrate;
    (b) supporting the mask with a mask support ring so as to inhibit heat transfer between the substrate support and the mask; and
    (c) flowing a purge fluid between the masked portion of the substrate and the mask.

2. The method as in claim 1, wherein the support ring is less thermally conductive than the substrate support.

3. The method as in claim 2, wherein supporting the mask includes providing a contact area, between the support ring and at least one of the mask and the substrate support, which is smaller than at least one cross-section through the support ring.

4. The method as in claim 3, wherein flowing the purge fluid includes flowing the purge fluid toward the center of the substrate.

5. An apparatus for inhibiting a process fluid from contacting a portion of a substrate, supported on a substrate support, comprising:
    (a) a mask, positioned over and separated from the substrate, and configured to obstruct the process fluid from flowing in a direction substantially perpendicular to a masked portion of the substrate;
    (b) a mask support ring, positioned around the substrate support to support the mask, and configured to inhibit heat transfer between the substrate support and the mask; and
    (c) a flow path, defined between the mask and the masked portion of the substrate, for flowing a purge fluid to inhibit the process fluid from entering the flow path.

6. The apparatus as in claim 5, wherein the support ring has a lower thermal conductivity than the substrate support.

7. The apparatus as in claim 6, wherein a contact area, between the support ring and at least one of the mask and the substrate support, is smaller than at least one cross-section through the support ring.

8. The apparatus as in claim 7, wherein the support ring is removable.

9. The apparatus as in claim 8, wherein the support ring includes a material having a smaller thermal coefficient of expansion than the substrate support.

10. The apparatus as in claim 5, wherein the purge fluid path is configured to deliver the purge fluid to flow in a direction toward the center of the substrate.

11. An apparatus in a processing chamber for inhibiting a process fluid from contacting a portion of a substrate, comprising:
  (a) a main body including a substrate support capable of supporting the substrate;
  (b) a mask, positioned over the substrate, and configured to obstruct the process fluid from flowing in a direction substantially perpendicular to a masked portion of the substrate; and
  (c) a mask support ring, circumscribing the main body and including a mask supporting portion configured to hold the mask clear of the substrate, the support ring being configured to inhibit heat transfer between the main body and the mask.

12. The apparatus as in claim 11, wherein the mask and the masked portion of the substrate define between them a purge fluid gap through which a purge fluid can flow to inhibit the process fluid from entering the flow path.

13. The apparatus as in claim 12, wherein the main body includes a ring, which when located between an inner wall of the support ring and an outer wall of the main body defines a purge fluid manifold, in communication with the purge fluid gap within a characteristic temperature range.

14. The apparatus as in claim 13, wherein the support ring has a lower thermal coefficient of expansion than the main body.

15. The apparatus as in claim 14, configured so that an outer wall of the ring is in contact with the inner wall of the support ring within the characteristic temperature range to form a mechanical seal to prevent purge gas from flowing through the seal.

16. The apparatus as in claim 15, wherein the inner wall of the support ring includes a radially protruding flange configured to minimize contact between the ring and the support ring within the characteristic temperature range.

17. The apparatus as in claim 16, wherein the main body includes a plurality of support pins configured to support the support ring, the support pins having a lower thermal conductivity than the main body.

18. The apparatus as in claim 17, wherein contact areas at the mask/support ring and ring/support pin interfaces are smaller than at least one cross-section through the support ring.

19. The apparatus as in claim 18, wherein the support ring is removable at temperatures lower than temperatures within the characteristic temperature range.

20. A method of supporting a shadow ring in a chamber, comprising:
  a) providing a shadow ring in the chamber on a support;
  b) providing a support ring around a main body, the support ring having minimal contact with the main body; and
  c) supporting the shadow ring.

21. The method of claim 20 wherein the support ring is disposed around the main body and comprises an inner annular flange which contacts the main body.

22. The method of claim 21 wherein the support ring is comprised of a material having a thermal coefficient of expansion which is less than the thermal coefficient of expansion of the support member.

23. The method of claim 22 wherein the inner annular flange forms a seal between the support ring and the main body.

24. The method of claim 23 wherein the support ring is supported on the support member on at least three support fingers.

25. The method of claim 24 wherein the inner annular flange is continuous around the support ring.

26. The method of claim 20 further comprising supporting the support ring on the main body on at least one insulating contact.

27. The method of claim 26 wherein the support ring further comprises an inner annular flange which contacts the main body.

28. The method of claim 27 wherein the inner annular flange forms a seal between the support ring and the main body.

* * * * *